United States Patent [19]

Kasser

[11] Patent Number: 4,704,736
[45] Date of Patent: Nov. 3, 1987

[54] METHOD AND APPARATUS FOR REDUCING INTERFERENCE IN BROADCAST RECEIVER

[75] Inventor: Jürgen Kasser, Diekholzen, Fed. Rep. of Germany

[73] Assignee: Blaupunkt-Werke GmbH, Hildesheim, Fed. Rep. of Germany

[21] Appl. No.: 808,855

[22] Filed: Dec. 13, 1985

[30] Foreign Application Priority Data

Dec. 20, 1984 [DE] Fed. Rep. of Germany ....... 3446529

[51] Int. Cl.$^4$ .............................................. H04B 1/10
[52] U.S. Cl. .................................. 455/213; 455/223; 455/225; 375/104
[58] Field of Search ............... 455/212, 213, 222–225, 455/303; 381/94, 104; 375/104

[56] References Cited

U.S. PATENT DOCUMENTS

| | | | |
|---|---|---|---|
| 4,107,613 | 8/1978 | Queen et al. | 455/219 |
| 4,304,004 | 12/1981 | Von Der Neyen | 375/104 |
| 4,531,095 | 7/1985 | Ishigaki et al. | 455/223 |
| 4,541,101 | 9/1985 | Potage et al. | 455/222 |
| 4,574,390 | 3/1986 | Hirohashi et al. | 455/223 |

FOREIGN PATENT DOCUMENTS

| | | | |
|---|---|---|---|
| 2262560 | 6/1974 | Fed. Rep. of Germany. | |
| 139417 | 10/1979 | Japan | 455/223 |
| 7933 | 1/1983 | Japan | 455/223 |
| 23930 | 2/1984 | Japan | 455/223 |
| 35837 | 2/1985 | Japan | 455/223 |

OTHER PUBLICATIONS

I. N. Bronstein and K. A. Semendjajew, "Taschenbuch der Mathematic", Verlag Harri Deutsch, Zurich, Frankfurt/Main, Thun, 1976, pp. 517–521.
Schafer and Rabiner, "Interpolation Using Finite Duration Impulse Response Digital Filters", Conference Signalverarbeitung, Erlangen, Apr. 1973, pp. 86–95.
Hamming "Digital Filters", Second Edition, Prentice-Hall, Inc. Englewood Cliffs, N.J. 07632, pp. 52–59.
R. W. Hamming "Digital Filters", Second Edition, Prentice-Hall, Inc., Englewood Cliffs, N.J. 07632, pp. 1–7, 32–45, 134–137.

Primary Examiner—Jin F. Ng
Attorney, Agent, or Firm—Frishauf, Holtz Goodman & Woodward

[57] ABSTRACT

For elimination of pulse type interference in an FM receiver by intermittent blanking of the received signal while interfering pulses are present and substitution of a synthetic signal during the blanking intervals, the synthetic signal substituted during the blanking intervals is produced by interpolation using finite duration impulse response digital filters, instead of using the last undisturbed value of the received signal modified by integration of its last value of rate of change with respect to time. The determination of the blanking interval is optimized by reference to the maximum and minimum peak values of the output of an AM detector of the received signal and comparing an interference signal magnitude thus obtained with a threshold value of the interference signal, so as to define the blanking interval as the interval during which the interference signal exceeds the reference signal value. The interference signal compared with the reference value is produced by computing the sum and product of the maximum and minimum peak values, adding the product to the output of the squarer operating on the output of the AM demodulator, multiplying the sum of the maximum and minimum peak values by the AM demodulator output, dividing the product plus squarer sum by the multiplied output of the AM demodulator, forming the arc cosine of the output of the divider and then differentiating the arc cosine value.

10 Claims, 2 Drawing Figures

METHOD AND APPARATUS FOR REDUCING INTERFERENCE IN BROADCAST RECEIVER

This invention concerns a method and apparatus particularly useful for reducing interference in an FM receiver usually receiving broadcasts at VHF radio frequencies and having a noise blanker monitoring the received signal for blanking it out during the presence of a disturbing signal and means for replacing the blanked out signal with a synthetic signal.

In a known method of this kind described in German published patent application (OS) No. 22 62 560, the synthetic signal to replace the blanked signal is generated by using the instantaneous value of the signal amplitude immediately before the appearance of the interfering signal together with the rate of rise present at this instant, and using these during the time interval of the disturbance. This is obtained by a cascade arrangement of a differentiator, a gate circuit, a storage device and an integrator, in the signal path. The normally opened gate circuit is closed by a noise detector for the duration of the interference. The instantaneous differential value of the input signal amplitude which is put in the storage device when the gate circuit is closed is integrated over the time interval of gate circuit closure, so that during this time interval of blanking the signal course defined as above mentioned is present at the output of the integrator.

In this known method, however, the signal course of a synthetic signal for the duration of blanking of the disturbed received signal does not accurately enough simulate the course of the undisturbed received signal in all cases. The simulation is adequate only in the case when the undisturbed received signal does not substantially change its course during the interval of gate closure. In all other cases, when the interference disappears and the gate circuit is opened, a more or less considerable voltage jump takes place which in turn produces distortion in the received signal.

SUMMARY OF THE INVENTION

It is an object of the present invention to provide a method and appropriate apparatus for reducing interference of the general kind above mentioned in which it is possible to avoid the distortion of the kind just mentioned and thereby to provide substantial improvement of reception.

Briefly, interpolation of the undisturbed received signal by one of the classic mathematical interpolation methods or some modified form thereof is utilized to supply the synthetic signal during the noise blanking interval. This has the advantage that the interpolated signal simulates the disturbed received signal during the blanked-out interval much more accurately, since for generation of the synthetic signal there is available not merely a single value of signal and its rate of rise, but rather a multiplicity of signal values from the past, and in case the blanked signal is delayed, also from the future. The precision depends only upon the interpolation formula used and upon the exact knowledge of the time interval of the disturbance. In order to detect the length of that interval exactly, a disturbance signal is derived from AM demodulation of the received signal and is compared with an amplitude or signal level threshold. The disturbed received signal is blanked out for as long as the value of the disturbing signal amplitude or the disturbing signal level exceeds that threshold.

Interpolation formulae based on digital filters can be used for the interpolation operation. Thus, it is possible to use interpolation of the Lagrange, Newton, Stirling or Bessel types, or modified algorithms based on one of these. Reference is made to the references set forth at the end of this specification, which are hereby incorporated by reference, regarding interpolation mathematics and the utility of these interpolation methods in connection with digital filters.

The Newtonian interpolation formula is preferred when only past support or sample values of the received signal are available, i.e., values from a time interval preceding the appearance of the disturbance in the received signal. The Stirling or Bessel formulae are particularly useful if future values of the received signal are available, which means values after the disturbance has disappeared. Such future values can be made available by delaying the received signal, so that the interpolation is carried out only after the disappearance of the disturbance for the benefit of a delayed signal.

It is particularly useful to provide adaptive modification of the threshold value since then it is possible to provide, even in the case of very strong interference, a received signal which is still adequately received even though somewhat less well. The more frequently that the received signal is disturbed, the more the threshold value is raised for such a purpose.

Apparatus for putting the invention to use is distinguished by economy both in hardware and software. It is particularly useful to use a blanking signal generator derived from the output of an AM demodulator in a special way further described in the description that follows.

BRIEF DESCRIPTION OF THE DRAWINGS

The invention is further described by way of illustrative example with reference to the annexed drawings, in which.

DESCRIPTION OF THE ILLUSTRATED EMBODIMENT

Figure 1:
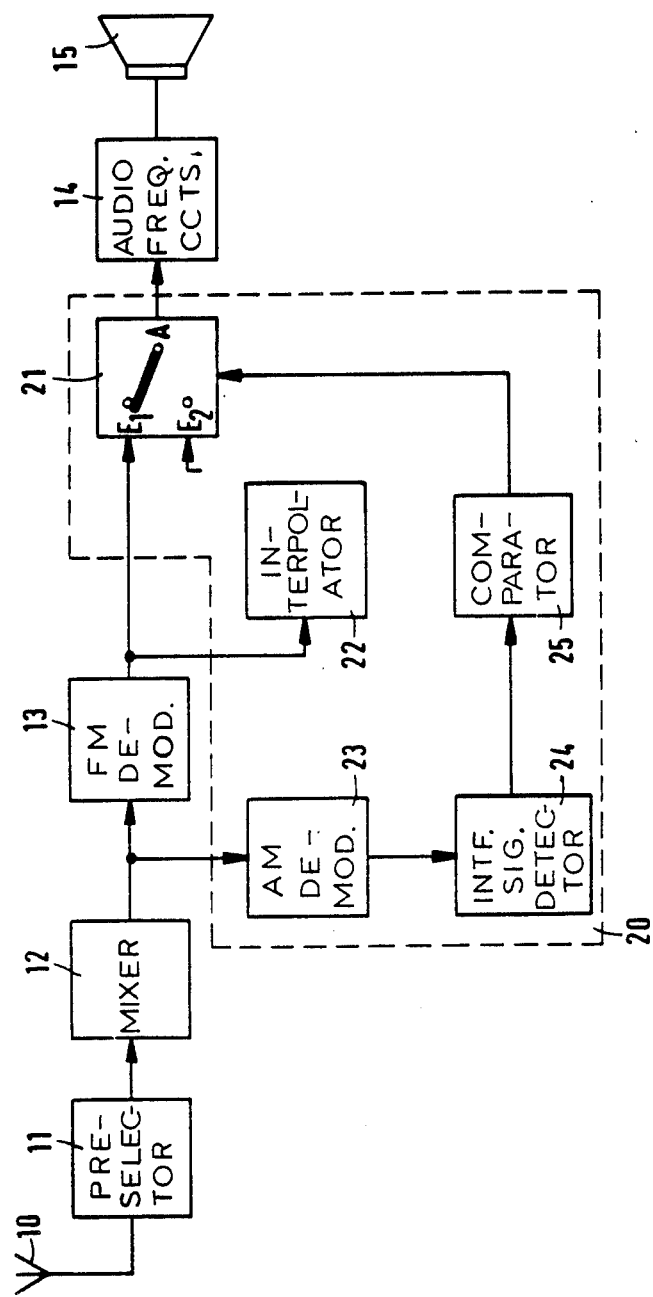
FIG. 1 is a block circuit diagram of an FM receiver with a noise-blanking circuit in accordance with the present invention.

FIG. 1 shows an FM receiver having a receiving antenna 10 connected to a preamplifier 11. The output of the preamplifier 11 goes to a mixer stage 12, the output of which goes to an FM demodulator 13. Following the FM demodulator 13, there are connected, in a known way, the low-frequency amplifier 14 to the output of which a loudspeaker 15 is connected.

A transfer switch 21 interposed between the FM demodulator 13 and the low-frequency amplifier 14 and forms part of a circuit 20 for noise or interference elimination or reduction. The switch 21 selects for the input of the low-frequency amplifier 14 either the switch contact $E_1$ connected to the output of the FM demodulator 13 or the switch contact $E_2$ connected with an interpolator 22. The switch 21 is an electronic switch and, instead of being interposed as shown in FIG. 1, it can be interposed at any other desired place in the signal path between the antenna 10 and the loudspeaker 15. The interpolator 2 can also be a part of an intermediate frequency portion (not shown in FIG. 1) of the receiver just ahead of the FM demodulator, in which case the intermediate frequency signal (i.f. signal) is supplied to its input for interpolation when necessary.

At the output of the mixer stage 12 an AM demodulator 23 is also connected, which provides an output that is connected to the input of the interference pulse detector 24. The interference pulse detector produces a detected signal from the AM demodulated received signal and furnishes that detected signal to a threshold comparator 25. So long as the detected signal is greater than the threshold value set into the comparator 25, the transfer switch 21 is so controlled that the bridge contact $E_2$ is connected with the switch output A, while the rest of the time the switch contact $E_1$ is connected to the switch output A. Switching over to the switch contact $E_2$ blanks out the received signal and supplies a synthetic signal produced by the interpolator 22 to the input of the low-frequency amplifier 14. In other words, the output of the comparator 25 is a blanking signal.

The interpolator 22 is a digital filter that is designed for operation in accordance with the Lagrange interpolation formula. It is however also possible for the digital filter of the interpolator to operate in accordance with other analagous solutions provided by one or another of the respective interpolation formulae of Newton, Stirling or Bessel. These various interpolation methods are described in Reference 1 at the end of this specification, and other possible constitutions of the interpolator 22 are described in References 2 and 3.

The following method of operation takes place in the illustrated FM receiver having the above-described circuits.

The broadcast signal received over the antenna 10 by the FM receiver and made audible in the loudspeaker 15 is continuously monitored for the presence of noise and other interference by the circuit unit 20. In that unit the interference signal detector 4 generates a detected signal representative of the interference in response to the AM demodulated received signal present at the output of the AM demodulator 23. For exact determination of the time duration of the disturbance, this detected disturbance signal is compared with a threshold value in the threshold comparator 25, which determines the beginning when the amplitude of the signal becomes greater than the threshold value and the end of the disturbance in the signal falls below the threshold value. During the time interval of the disturbance so defined, the electronic transfer switch 21 is set in contact with its input contact $E_2$ by the switch 21 to blank out the received signal and to receive instead the synthetic signal produced by the interpolator 22.

If the interpolator 22 operates according to the Newtonian interpolation formula, only past values, meaning values of the undisturbed received signal immediately before the appearance of the disturbance, are used to generate the synthetic signal for the time interval of the disturbance detected by the comparator 25. If the interpolator 22, on the other hand, operates in accordance with the Stirling or Bessel interpolation method, the synthetic signal can be derived by signal values both before and after the disturbance. For this purpose it is necessary for the received signal to be delayed so that the subsequent values after the blanking may be available for carrying out the interpolation.

It is useful for the threshold in the comparator 25 to be adaptively modified according to the gravity of the disturbance. The more frequently disturbances appear in the received signal, the higher the threshold of the comparator will be set.

Figure 2:
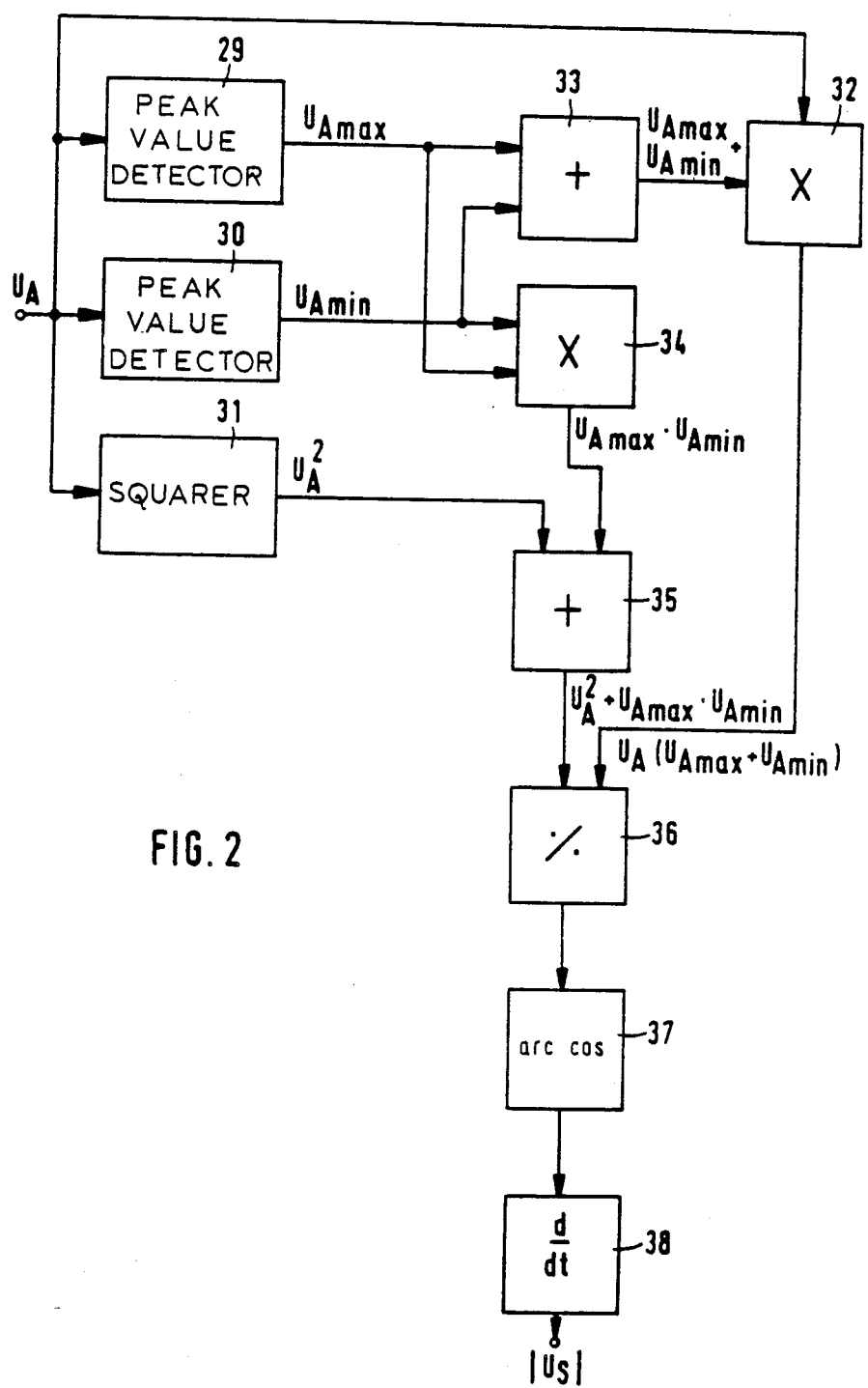
FIG. 2 is a block circuit diagram of an interference signal detector for the circuit of FIG. 1.

The constitution of the interference signal detector 24 is shown in block circuit diagram in FIG. 2. This device has a peak value detector 29 for the amplitude maximum $U_{Amax}$ and a peak value detector 30 for the amplitude minimum $U_{Amin}$ of the demodulated received signal $U_A$ at the output of the AM demodulator 23. There is also a squarer 31 and a first multiplier 32. These also have a connection to the input $U_A$ of the interference signal detector 24 which comes from the output of the AM demodulator 23. The outputs of the two peak value detectors 29, 30 are connected on the one hand to a first adder 33 and on the other hand to a second multiplier 34. The output of the first adder 33 is supplied to a second input of the first multiplier 32 and the output of the second multiplier 34 is supplied together with the output of the squarer 31 to a second adder 35.

The outputs of the first multiplier 32 and of the second adder 35 are connected with a divider 36 in such a way that the output value of the second adder 35 is divided by the output value of the first multiplier 32. An arc-cosine network 33 is connected to the output of the divider 36 and provides an output to a differentiator 38. The output signals of the individual circuit blocks 29–38 are designated by legends, except for the blocks 36 and 37, so that it is readily observable that at the output of the interference signal detector 24 a value of the detected signal $U_S$ is provided that satisfies the following equation:

$$|U_S| = U_D \left| \frac{d}{dt} \text{arc cos} \frac{U_A^2 + U_{Amax} \cdot U_{Amin}}{U_A \cdot (U_{Amax} + U_{Amin})} \right|.$$

in which $U_{Amax}$ and $U_{Amin}$ are the peak values of the demodulated received signal $U_A$, while $U_D$ represents the demodulator characteristic of the AM demodulator. This output value is supplied to the comparator 25. So long as this output value is smaller than the threshold set in the comparator, the transfer contact of the switch 21 takes the position shown in FIG. 1, the basic or normal position, and the undisturbed received signal is made audible in the loudspeaker 15 in the usual way. So long as the output value of the interference signal detector 24 exceeds the comparator threshold, the transfer contact of the electronic switch 21 switches over so that from then on the disturbed received signal is blanked out and is replaced by the synthetic signal produced by the interpolator 22 by interpolation of the undisturbed time-adjacent portion of the received signal.

Although the invention has been described with reference to a particular illustrative embodiment, it will be understood that modifications and variations are possible within the inventive concept.

It is further noted that the interpolation methods, including extrapolation methods, referred to herein as being useful in the practice of the present invention, are all distinguished from simple extrapolation according to the prior practice of providing the synthetic signal in a form beginning at the signal value just before the beginning of the blanking interval modified by integration during the blanking interval of its rate of change (first derivative with respect to time) just before the blanking interval began, is that the interpolation methods according to the present invention require at least three signal sample values or at least one sample values plus two time derivatives of the signal (this is really a single criterion, because if the samples are not far separated in time, which would normally be the case, three samples could be used to provide two time derivatives that in turn could be used with one sample) value. A time derivative of the signal is of course the same thing as a time derivative of signal sample value.

References

[1] Bronstein and Semendjajew "Taschenbuch der Mathematik", Verlag Harri Deutsch, Zürich, Frankfurt/Main, Thun, 1976, pp. 517–521.

[2] Schafer and Rabiner "Interpolation Using Finite Duration Impulse Response Digital Filters", Conference "Signalverarbeitung", Erlangen, April 1973, pp. 86–95.

[3] Hamming "Digital Filters", Second Edition, Prentice-Hall, Inc. Englewood Cliffs, N.J. 07632, pp. 52–59.

I claim:

1. Method of reducing disturbance of an FM VHF signal by high-amplitude interfering pulses received with said signal in an FM receiver, comprising the steps of monitoring the received signal to detect high-amplitude interfering pulses, blanking reception by said receiver for intervals determined by detection of said pulses and replacing said received signal by a synthetic signal during said intervals for which reception by said receiver is blanked, wherein:

said blanking step is timed and performed by the substeps of detecting an interference pulse signal in response to AM demodulation of said received signal, comparing said interference pulse signal with a threshold signal value representing a reference pulse amplitude to determine the beginning and end of an interval during which said detected interference pulse signal has an amplitude exceeding said reference pulse amplitude and providing a blanking signal for said receiver which begins and ends with the beginning and end of said interval, and said synthetic signal for replacing the blanked portion of said received signal is derived from said received signal by electronically computed interpolation requiring at least three data elements, at least one of which said three data elements is a signal sample magnitude value, the remainder, if any, of said three data elements being in each case a magnitude value of a time derivative of signal sample magnitude value.

2. Method according to claim 1, in which said derivation of said synthetic signal by electronically computed interpolation is performed by interpolation using finite duration impulse response digital filters.

3. Method according to claim 2, which includes also the step of varying said threshold signal value in accordance with an average value of interference pulse amplitude.

4. Method according to claim 1 which includes also the step of varying said threshold signal value in acordance with amplitude and rate of occurrence of said interfering pulses.

5. Method according to claim 1, which includes also the step of varying said threshold signal value in accordance with an average value of interference pulse amplitude.

6. Apparatus for elimination of pulse-type interference from an FM signal in an FM receiver having electronic circuits including a signal path therein for a received signal, by intermittently blanking said signal and replacing said signal with a synthetic signal during said blanking, comprising:

an electronically controlled signal selection switch (21) interposed in said signal path of said FM receiver for selection of a signal for further transmission in said signal path, by selection between said synthetic signal and a signal received at the input of the receiver and processed in said signal path between said receiver input and said electronically controllable switch;

an interpolator using finite duration impulse response digital filters (22) having an output connected to said electronically controlled switch for supplying said synthetic signal to said signal path during said blanking intervals, the input to said interpolator being connected to the same point of said signal path which is connected to said electronically controlled switch so as to supply a signal derived from said receiver input through said switch to another portion of said signal path, except during said blanking intervals; and means for detecting an interference pulse signal, including an AM demodulator connected in said signal path at a point where the magnitude of interference pulses are detectable and means (25) for comparing said interference pulse signal with a threshold signal value representing a reference pulse amplitude and thereby providing a blanking signal having a duration beginning when said reference pulse signal begins to exceed said reference pulse amplitude and ending when said interference pulse signal ceases to exceed said reference pulse amplitude, the output of said comparing means being supplied to control operation of said electronically controllable switch for blanking said received signal while supplying said synthetic signal.

7. Apparatus according to claim 6, wherein said AM demodulator (23) of said interference pulse signal detecting means has its input connected to the output of a mixer stage in said receiver.

8. Apparatus according to claim 6, in which said interference pulse detecting means includes a first peak detector (29) for the amplitude maximum of the output of said AM detector (23) and a second peak detector (30) for the amplitude minimum of the output of said AM detector (23), a squarer (31) and a first multiplier (32) having their respective inputs connected to the output of said AM demodulator (23), a first adder connected to the outputs of said first and second peak detectors (29,30) for adding signal values at said respective outputs, a second multiplier (34) connected to the outputs of said peak detectors (29,30) for multiplying together signal values at said respective outputs, said first adder (33) having its output connected to a second input of said first multiplier (32), a second adder (35) being provided having two inputs respectively connected to the outputs of said second multiplier (34) and of said squarer (31), a divider (36) being provided for dividing the output value provided at the output of said second adder (35) by the output value provided by the output of said first multiplier (32), an arc cosine network (37) having its input connected to the output of said divider (36) and a differentiator (38) having its input connected to the output of said arc cosine network (37) for providing a differentiated output to said comparing means as an interference pulse signal for comparison with a threshold signal value representing a reference pulse amplitude.

9. Apparatus according to claim 6, wherein said interpolator (22) has its input connected to the output of an FM demodulator (13) which is one of the components of said receiver interposed in said signal path.

10. Apparatus according to claim 6, wherein said electronically controlled switch (21) is interposed in said signal path at a location immediately following an FM demodulator (13) interposed in said signal path.

* * * * *